US006495843B1

(12) United States Patent
Tavkelidze

(10) Patent No.: US 6,495,843 B1
(45) **Date of Patent: *Dec. 17, 2002**

(54) METHOD FOR INCREASING EMISSION THROUGH A POTENTIAL BARRIER

(75) Inventor: Avto Tavkelidze, Tbilisi (GE)

(73) Assignee: Borealis Technical Limited (GI)

( * ) Notice: Subject to any disclaimer, the term of this patent is extended or adjusted under 35 U.S.C. 154(b) by 0 days.

This patent is subject to a terminal disclaimer.

(21) Appl. No.: 09/645,997

(22) Filed: Aug. 31, 1998

Related U.S. Application Data

(63) Continuation-in-part of application No. 09/020,654, filed on Jun. 29, 1998, now Pat. No. 6,281,514, and a continuation-in-part of application No. 09/645,985, filed on Jun. 29, 1998.

(51) Int. Cl.[7] .................................................. H01L 29/15

(52) U.S. Cl. ......................... 250/493.1; 257/10; 257/17

(58) Field of Search ......................... 250/493.1; 257/10, 257/17

(56) References Cited

U.S. PATENT DOCUMENTS 5,604,357 A * 2/1997 Hori ............................ 257/24
6,281,514 B1 * 8/2001 Tavkhelidze ............. 250/493.1

* cited by examiner

*Primary Examiner*—Jack Berman

(57) ABSTRACT

A method for promoting the passage of elementary particles at or through a potential barrier comprising providing a potential barrier having a geometrical shape for causing de Broglie interference between said elementary particles is disclosed. In another embodiment, the invention provides an elementary particle-emitting surface having a series of indents. The depth of the indents is chosen so that the probability wave of the elementary particle reflected from the bottom of the indent interferes destructively with the probability wave of the elementary particle reflected from the surface. This results in the increase of tunneling through the potential barrier. When the elementary particle is an electron, then electrons tunnel through the potential barrier, thereby leading to a reduction in the effective work function of the surface. In further embodiments, the invention provides vacuum diode devices, including a vacuum diode heat pump, a thermionic converter and a photoelectric converter, in which either or both of the electrodes in these devices utilize said elementary particle-emitting surface. In yet further embodiments, the invention provides devices in which the separation of the surfaces in such devices is controlled by piezo-electric positioning elements. A further embodiment provides a method for making an elementary particle-emitting surface having a series of indents.

46 Claims, 4 Drawing Sheets

METHOD FOR INCREASING EMISSION THROUGH A POTENTIAL BARRIER

CROSS REFERENCE TO RELATED APPLICATIONS

This is a Continuation in Part of a Continuation in Part filed Jun. 29, 1998 of U.S. patent application Ser. No. 09/020,654, filed Feb. 9, 1998, now U.S. Pat. No. 6,281,514, and a Continuation in Part of Ser. No. 09/645,985 filed Jun. 29, 1998.

This application is also related to "Diode Device" by Tavkheldize and Edelson, filed Aug. 31, 1998 as a Continuation in Part filed Aug. 31, 1998 of a Continued Prosecution Application filed Mar. 3, 1998 of U.S. patent application Ser. No. 08/924,910 filed Sep. 8, 1998 and assigned to the same assignee as the present invention.

FIELD OF THE INVENTION

The present invention is concerned with methods for promoting the transfer of elementary particles across a potential energy barrier.

BACKGROUND

Vacuum Diodes and Thermionic Devices

In Edelson's disclosure, filed Mar. 7, 1995, titled "Electrostatic Heat Pump Device and Method", Ser. No. 08/401, 038, now abandoned, assigned to the same assignee as the present invention and incorporated herein by reference in its entirety, two porous electrodes were separated by a porous insulating material to form an electrostatic heat pump. In said device, evaporation and ionization of a working fluid in an electric field provided the heat pumping capacity. The use of electrons as the working fluid is disclosed in that application. In Edelson's subsequent disclosure, filed Jul. 5, 1995, titled "Method and Apparatus for Vacuum Diode Heat Pump", Ser. No. 08/498,199, now U.S Pat No. 6,089,316 assigned to the same assignee as the present invention, an improved device and method for the use of electrons as the working fluid in a heat pumping device is disclosed. In this invention, a vacuum diode is constructed using a low work function cathode.

In Edelson's further subsequent disclosure, filed Dec. 15, 1995, titled "Method and Apparatus for Improved Vacuum Diode Heat Pump", U.S. Pat. No. 5,722,242, assigned to the same assignee as the present invention and incorporated herein by reference in its entirety, the work function of the anode was specified as being lower than the work function of the cathode in order to optimize efficient operation.

In a yet further subsequent disclosure, filed Dec. 27, 1995, titled "Method and Apparatus for a Vacuum Diode Heat Pump With Thin Film Ablated Diamond Field Emission", Ser. No. 08/580,282, now abandoned assigned to the same assignee as the present invention and incorporated herein by reference in its entirety, Cox and Edelson disclose an improvement to the Vacuum Diode Heat Pump, wherein a particular material and means of construction was disclosed to further improve upon previous methods and devices.

The Vacuum Diode at the heart of Edelson's Vacuum Diode Heat Pump may also be used as a thermionic generator: the differences between the two devices being in the operation of the diode, the types and quantities of external energy applied to it, and the provisions made for drawing off, in the instance of the thermionic converter, an electrical current, and in the instance of the Vacuum Diode Heat Pump, energy in the form of heat.

In Cox's disclosure, filed Mar. 6, 1996, titled "Method and Apparatus for a Vacuum Thermionic Converter with Thin Film Carbonaceous Field Emission", Ser. No. 08/610, 599, now abandoned, assigned to the same assignee as the present invention and incorporated herein by reference in its entirety, a Vacuum Diode is constructed in which the electrodes of the Vacuum Diode are coated with a thin film of diamond-like carbonaceous material. A Vacuum Thermionic Converter is optimized for the most efficient generation of electricity by utilizing a cathode and anode of very low work function. The relationship of the work functions of cathode and anode are shown to be optimized when the cathode work function is the minimum value required to maintain current density saturation at the desired temperature, while the anode's work function is as low as possible, and in any case lower than the cathode's work function. When this relationship is obtained, the efficiency of the original device is improved.

Many attempts have been made to find materials with low work function for use as cathodes for vacuum diodes and thermionic energy converters. Currently most research is in the field of cathodes for vacuum tubes. Research in thermionic converter technology is less intensive because of the difficulties of increasing thermionic emission of electrons from the flat surface, where field emission effect can not be applied. The practical importance of thermionic energy conversion is rapidly increasing due to increased needs for alternative energy sources. The most effective way of decreasing work function known today is the use of alkaline metal vapors, particularly cesium, and coating the emitter surface with oxide thin films. Use of Cs vapor is not without technical problems, and thin film coated cathodes generally show short lifetimes.

Thermotunnel Converter

The thermotunnel converter is a means of converting heat into electricity which uses no moving parts. It has characteristics in common with both thermionic and thermoelectric converters. Electron transport occurs via quantum mechanical tunneling between electrodes at different temperatures. This is a quantum mechanical concept whereby an electron is found on the opposite side of a potential energy barrier. This is because a wave determines the probability of where a particle will be, and when that probability wave encounters an energy barrier most of the wave will be reflected back, but a small portion of it will 'leak' into the barrier. If the barrier is small enough, the wave that leaked through will continue on the other side of it. Even though the particle does not have enough energy to get over the barrier, there is still a small probability that it can 'tunnel' through it.

The thermotunneling converter concept was disclosed in U.S. Pat. No. 3,169,200 to Huffman. In a later paper entitled "Preliminary Investigations of a Thermotunnel Converter", [23rd Intersociety Energy Conversion Engineering Conference vol. 1, pp. 573–579 (1988)] Huffman and Haq disclose chemically spaced graphite layers in which cesium is intercalated in highly orientated pyrolitic graphite to form a multiplicity of thermotunneling converters in electrical and thermal series. In addition they teach that the concept of thermotunneling converter was never accomplished because of the impossibility of fabricating devices having electrode spacings of less than 10 $\mu$m. The current invention addresses this shortcoming by utilizing a piezo-electric, electrostrictive or magnetostrictive element to control the separation of the electrodes so that thermotunneling between them occurs.

A further shortcoming of the devices described by Huffman is thermal conduction between the layers of the converter, which greatly reduces the overall efficiency of these thermotunnelling converters.

Photoelectric Converter

In Edelson's application filed 12th May 1997, titled "Method and Apparatus for Photoelectric Generation of Electricity", Ser. No. 08/854,302, now U.S. Pat. No. 5,973,259, assigned to the same assignee as the present invention and incorporated herein by reference, is described a Photoelectric Generator having close spaced electrodes separated by a vacuum. Photons impinging on the emitter cause electrons to be emitted as a consequence of the photoelectric effect. These electrons move to the collector as a result of excess energy from the photon: part of the photon energy is used escaping from the metal and the remainder is conserved as kinetic energy moving the electron. This means that the lower the work function of the emitter, the lower the energy required by the photons to cause electron emission. A greater proportion of photons will therefore cause photo-emission and the electron current will be higher. The collector work function governs how much of this energy is dissipated as heat: up to a point, the lower the collector work function, the more efficient the device. However there is a minimum value for the collector work function: thermionic emission from the collector will become a problem at elevated temperatures if the collector work function is too low.

Collected electrons return via an external circuit to the cathode, thereby powering a load. One or both of the electrodes are formed as a thin film on a transparent material, which permits light to enter the device. A solar concentrator is not required, and the device operates efficiently at ambient temperature.

Quantum Mechanics and de Broglie Wave

It is well known from Quantum Mechanics that elementary particles have wave properties as well as corpuscular properties. The density of probability of finding an elementary particle at a given location is where $|\psi|^2$ where $\psi$ is a complex wave function and has form of the de Broglie wave:

$$\psi=A\ \exp[(-i2\pi/h)(Et-pr)] \tag{1}$$

Here $\psi$ is wave function; h is Planck's constant; E is energy of particle; p is impulse or momentum of particle; r is a vector connecting initial and final locations; t is time.

There are well known fundamental relationships between the parameters of this probability wave and the energy and impulse of the particle:

$$E \text{ is electron energy and } p=(h/2\pi)k \tag{2}$$

Here k is the wave number of probability wave. The de Broglie wavelength is given by:

$$\lambda=2\pi/k \tag{3}$$

If time, t, is set to 0, the space distribution of the probability wave may be obtained. Substituting (2) into (1) gives:

$$\psi=A\ \exp(ikr) \tag{4}$$

FIG. 1 shows an elementary particle wave moving from left to right perpendicular to a surface 7 dividing two domains. The surface is associated with a potential barrier, which means the potential energy of the particle changes as it passes through it.

Incident wave 1 A exp(ikx) moving towards the border will mainly reflect back as reflected wave 3 βA exp(−ikx), and only a small part leaks through the surface to give transmitted wave 5 α(x)A exp(ik'x) ($\beta\approx1>>\alpha$). This is the well-known effect known as quantum mechanical tunneling. The elementary particle will pass the potential energy barrier with a low probability, depending on the potential energy barrier height.

Electron Interference

Usagawa in U.S. Pat. No. 5,233,205 discloses a novel semiconductor surface in which interaction between carriers such as electrons and holes in a mesoscopic region and the potential field in the mesoscopic region leads to such effects as quantum interference and resonance, with the result that output intensity may be changed. Shimizu in U.S. Pat. No. 5,521,735 discloses a novel wave combining and/or branching device and Aharanov-Bohm type quantum interference devices which have no curved waveguide, but utilize double quantum well structures.

Mori in U.S. Pat. No. 5,247,223 discloses a quantum interference semiconductor device having a cathode, an anode and a gate mounted in vacuum. Phase differences among the plurality of electron waves emitted from the cathode are controlled by the gate to give a quantum interference device operating as an AB type transistor.

Other quantum interference devices are also disclosed by Ugajin in U.S. Pat. No. 5,332,952 and Tong in U.S. Pat. No. 5,371,388.

Piezo-Electric Positioning

In their U.S. patent application Ser. No. 08/924,910 filed Sep. 8, 1997, now abandoned, and Continuation in Part application Ser. No. 08/481,803 filed Aug. 31, 1998, assigned to the same assignee as the present invention and incorporated herein by reference in its entirety, Tavkhelidze and Edelson describe diode devices in which the separation of the electrodes is effected using piezo-electric positioning elements. They also teach a method for fabricating electrodes in which imperfections on one are exactly mirrored in the other, which allows electrode to be positioned very closely together.

BRIEF DESCRIPTION OF THE INVENTION

Broadly the present invention is a method for enhancing the passage of elementary particles through a potential energy barrier utilizing interference of de Broglie waves to increase the probability of emission. This represents an improvement over all the aforementioned technologies.

In one embodiment, the invention provides an elementary particle-emitting surface having a series of indentations or protrusions. The depth of the indents (or height of the protrusions) is chosen so that the probability wave of the elementary particle reflected from the bottom of the indent interferes destructively with the probability wave of the elementary particle reflected from the surface. This results in a reduction of reflecting probability and as a consequence the probability of tunneling through the potential barrier to an adjacent surface is increased.

In another embodiment, the adjacent surface is absent. In this case, the energy spectrum of electrons becomes modified such that electrons may not tunnel out into the vacuum. This results in an increase in the Fermi level with a consequent reduction in apparent work function. The result is a surface which can be used in virtually any cathode application, including electronic circuits, antennas, imaging, amplifiers, flat-panel displays (FEDs), and all cold-cathode applications including cathode ray tubes.

In a further embodiment, the probability wave extends beyond the barrier, allowing electrons to be pumped into vacuum with a suitably applied voltage to give enhanced field effect emission.

In further embodiments, the invention provides vacuum diode devices, including a vacuum diode heat pump, a thermionic converter and a photoelectric converter, in which either or both of the electrodes in these devices utilize said elementary particle-emitting surface.

In yet further embodiments, the invention provides devices in which the separation of the surfaces in such devices is controlled by piezo-electric positioning elements.

A further embodiment provides a method for making an elementary particle-emitting surface having a series of indentations or protrusions.

OBJECTS AND ADVANTAGES

Objects of the present invention are, therefore, to provide new and improved methods and apparatus for particle emission, having one or more of the following capabilities, features, and/or characteristics:

An object of the present invention is to provide a method for promoting transfer of elementary particles across a potential barrier, comprising providing a surface on which the potential barrier appears having a geometrical shape for causing de Broglie interference between said elementary particles.

An advantage of the present invention is that destructive interference between the waves of emitted particles may be created, which allows for an increase in particle emission.

A further object of the present invention is to provide an elementary particle-emitting surface having a geometrical shape for causing de Broglie interference.

An advantage of the present invention is that thermionic emission is greatly enhanced and becomes an extremely practical technology.

An object of the present invention is to provide a surface having a series of indentations (or protrusions), the depth of which is chosen so that the probability wave of the elementary particle reflected from the bottom of the indent interferes destructively with the probability wave of the elementary particle reflected from the surface.

An advantage of the present invention is that the effective work function of the material comprising the surface is reduced.

REFERENCE NUMERALS IN THE DRAWINGS

Figure 1:
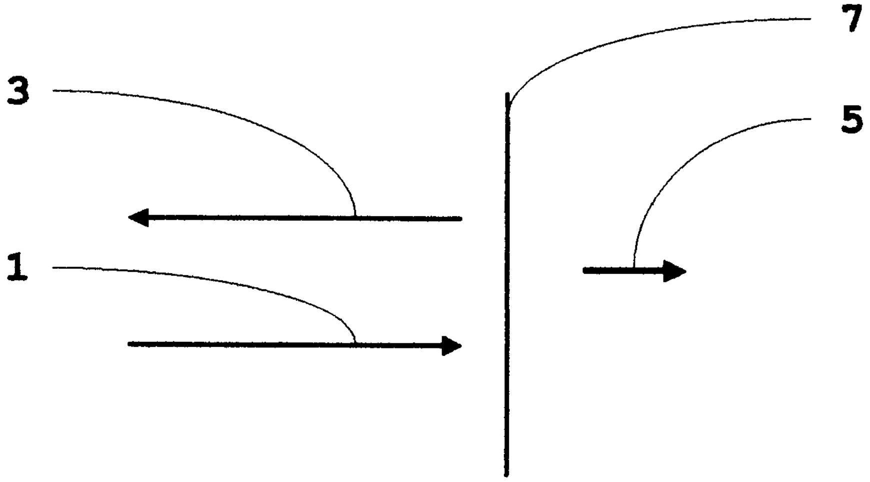
FIG. 1 shows in diagrammatic form, an incident probability wave, a reflected probability wave and a transmitted probability wave interacting with a substantially planar surface.

1. Electron 1
2. Electron 2
3. Electron 3
11. Incident probability wave
13. Reflected probability wave
15. Transmitted probability wave
17. Surface
19. Indented or protruded surface
21. Reflected probability wave
51. Emitter electrode
53. Collector electrode
55. Gap between electrodes
59. Heat sink
61. Heat source
63. Piezo-element actuators
65. Electrical connectors
67. Electrical load
69. Capacitance controller

DETAILED DESCRIPTION OF THE INVENTION

Figure 2:
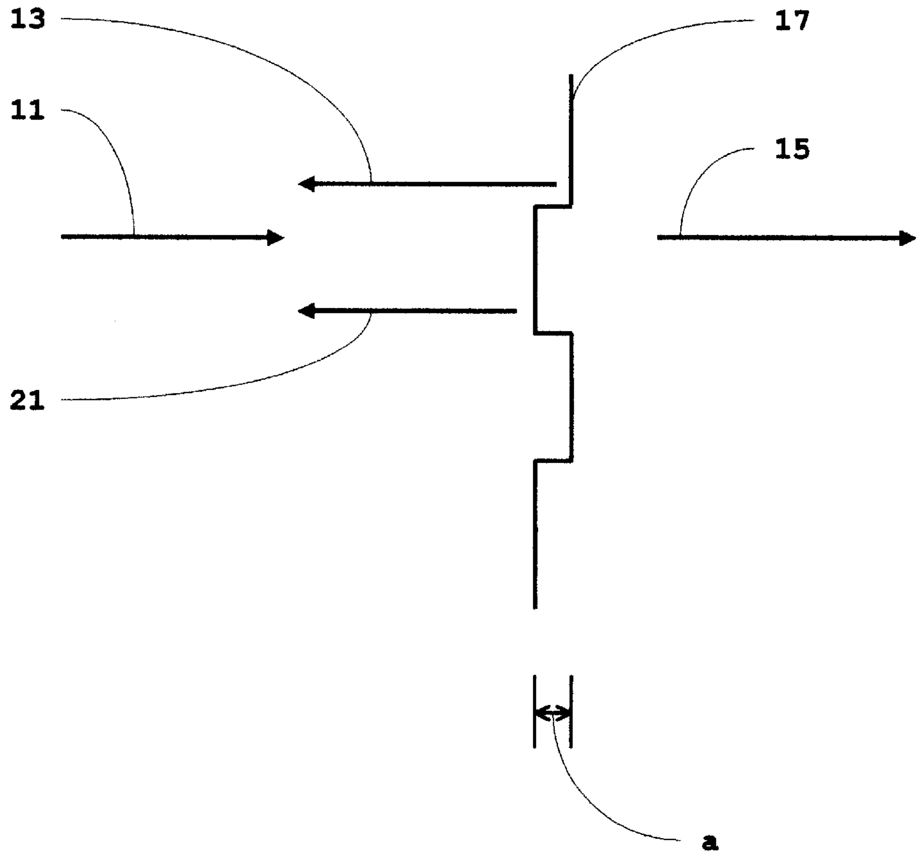
FIG. 2 shows in diagrammatic form, an incident probability wave, two reflected probability waves and a transmitted probability wave interacting with a surface having a series of indents (or protrusions).

Referring now to FIG. 2, two domains are separated by a surface 17 having an indented or protruded shape, with height a.

An incident probability wave 11 is reflected from surface 17 to give reflected probability wave 13, and from the bottom of the indent to give reflected probability wave 21. The reflected probability wave will thus be:

$$A\beta\exp(-ikx)+A\beta\exp[-ik(x+2a)]=A\beta\exp(-ikx)[1+\exp(-ik2a)] \quad (5)$$

When $k2a=\pi$, $\exp(-i\pi)=-1$ and equation (5) will equal zero.

Physically this means that for $k2a=(2\pi/\lambda)2a=\pi+2\pi n$ and correspondingly $\lambda=4a/(1+2n)$ where $n=0, 1, 2 \ldots$, the reflected probability wave equals zero. Further this means that the particle will not reflect back from the border. It also implies that the probability wave can leak through the barrier will occur with increased probability, and will open many new possibilities for different practical applications.

Without being bound by any particular theory, the enhanced leakage of electrons from a surface having the indented or protruded shape shown in FIG. 2 may be explained a number of different ways according to currently known theories of matter.

If the surface interference works to allow right-moving probability wave 15 to pass through the surface into the vacuum, without seeing the barrier, then it should work to allow a corresponding left moving wave (not shown in FIG. 2) to pass through the surface from the vacuum into the conductor, again without seeing the barrier.

If another conductor is arranged nearby, with a similar surface treatment, then this wavefunction would continue into the other conductor, thus becoming a tunneling path. The electron never makes it to the vacuum level, and thus does not violate conservation laws if it falls back to the other conductor.

But in the absence of another conductor, it is less clear how the electron may behave. Several possibilities are excluded:

1. Electron cannot reflect back into the conductor because wave mechanics forbids it.

2. Electron cannot move into the vacuum because this transition is forbidden (the electron would have negative kinetic energy).

3. Electron cannot stop on the surface. This will lead to accumulation of charge on the surface, which is contrary to the laws of electrostatics and thermodynamics.

4. Electron can not vanish.

This suggests that an electron with a wavelength corresponding to the step dimension $a=\lambda/4$ cannot exist in the material. The same is true for harmonics of that wavelength. This means that gaps will appear in the energy spectrum below Fermi level (as in a semiconductor). This means that the Fermi level will increase because the number of electron (per volume) is not changed and they all should have separate levels (electrons are fermions). This will result in a lower work function.

Indents or protrusions on the surface should have dimensions comparable to de Broglie wavelength of electron. In particular indent or protrusion height should be $$a=\lambda(1+2n)/4 \tag{6}$$

Here n=0,1,2, etc (preferably 0 to 4)

If these requirements are satisfied then the de Broglie wave is not reflected back from the surface.

For a semiconductor material, the velocities of electrons in the electron gas is given by the Maxwell-Boltsman distribution:

$$F(v)dv=n(m/2\pi K_BT)\exp(-mv^2/2K_BT)dv \tag{7}$$

where F(v) is the probability of an electron having a velocity between v and v+dv.

The average velocity of the electrons is $$V_{av}=(3K_BT/m)^{1/2} \tag{8}$$

and the de Broglie wavelength corresponding to this velocity, calculated using formulas (2), (3) and the classical approximation p=mv is:

$$\lambda=h/(3m\,K_BT)^{1/2}=62\text{ Å for }T=300\text{K}$$

This gives a value for a of 76/4=19 Å. Indents or protrusions of these dimensions may be constructed on a surface by a number of means known to the art of micromachining. Alternatively, the indented or protruded shape may be introduced by depositing a series of islands on the surface.

For metals, free electrons are strongly coupled to each other and form a degenerate electron cloud. Pauli's exclusion principle teaches that two or more electrons may not occupy the same quantum mechanical state: their distribution is thus described by Fermi-Dirac rather than Maxwell-Boltsman. In metals, free electrons occupy all the energy levels from zero to the Fermi level ($\epsilon_f$).

Figure 3:
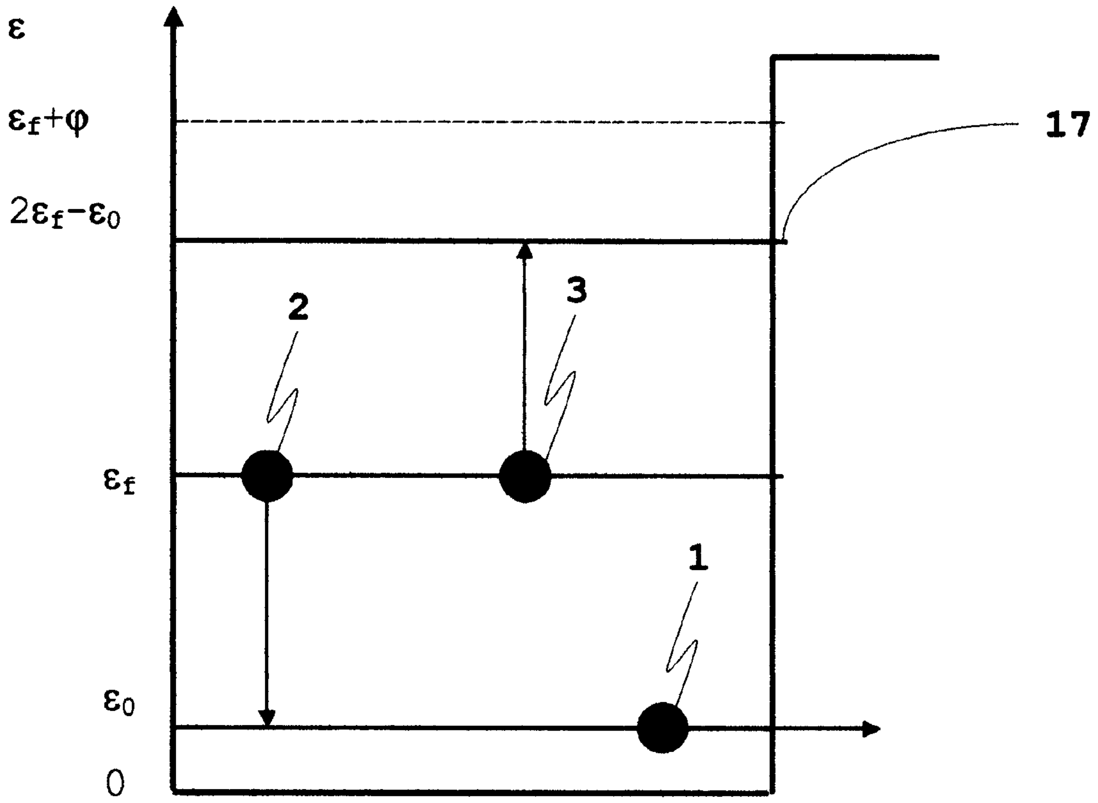
FIG. 3 shows in a diagrammatic form, the behavior of an electron in a metal

Referring now to FIG. 3, electron 1 has energy below the Fermi level, and the probability of occupation of these energy states is almost constant in the range of 0-$\epsilon_f$ and has a value of unity. Only in the interval of a few $K_BT$ around $\epsilon_f$ does this probability drop from 1 to 0. In other words, there are no free states below $\epsilon_f$. This quantum phenomenon leads to the formal division of free electrons into two groups: Group 1, which comprises electrons having energies below the Fermi level, and Group 2 comprising electrons with energies in the interval of few $K_BT$ around $\epsilon_f$.

For Group 1 electrons, all states having energies a little lower or higher are already occupied, which means that it is quantum mechanically forbidden for them to take part in current transport. For the same reason electrons from Group 1 cannot interact with the lattice directly because it requires energy transfer between electron and lattice, which is quantum mechanically forbidden.

Electrons from Group 2 have some empty energy states around them, and they can both transport current and exchange energy with the lattice. Thus only electrons around the Fermi level are taken into account in most cases when properties of metals are analyzed.

For electrons of group 1, two observations may be made. The first is that it is only these electrons which have. wavelengths comparable to dimensions achievable by current fabrication techniques: 50–100 Å corresponds to about $0.01\epsilon_f,(E\sim k^2\sim(1/\lambda)^2)$. Group 2 electrons of single valence metals on the other hand, where $\epsilon_f$=2–3 eV, have a de Broglie wavelength around 5–10 Å which is difficult to fabricate using current techniques.

The second is that for quantum mechanical interference between de Broglie waves to take place, the main free path of the electron should be large. Electrons from group 1 satisfy this requirement because they effectively have an infinite main free path because of their very weak interaction with the lattice.

Referring again to FIG. 3 electron 1, which is a group 1 electron, has $k_0=\lambda/2a$ and energy $\epsilon_0$, and is moving to the indented or protruded surface 17. As discussed above, this particular electron will not reflect back from the surface due to interference of de Broglie waves, and will leave the metal, if a another metal nearby is present to which the electron can tunnel. Consider further that the metal is connected to a source of electrons, which provides electron 2, having energy close to $\epsilon_f$ (group 2). As required by the thermodynamic equilibrium electron 2 will lose energy to occupy state $\epsilon_0$, losing energy $\epsilon_f-\epsilon_0$, for example by emission of a photon with energy $\epsilon_p$ ($\epsilon_{f-\epsilon0}$). If this is absorbed by electron 3, electron 3 will be excited to a state having energy $\epsilon_f+\epsilon_p=2\epsilon_f-\epsilon_0$.

Thus as a consequence of the loss of electron 1, electron 3 from the Fermi level is excited to a state having energy $2\epsilon_f-\epsilon_0$, and could be emitted from the surface by thermionic emission. The effective work function of electron 3 is reduced from the value of $\phi$ to $\phi-\epsilon_f+\epsilon_0=\phi-(\epsilon_f-\epsilon_0)$. In another words, the work function of electron 3 is reduced by $\epsilon_f-\epsilon_0$.

If another-surface is not adjacent to which the electron can tunnel, then an electron with this wavelength cannot exist (as discussed above) and will create a gap in the energy spectrum below the Fermi level. This will increase the Fermi level, leading to a reduction in work function.

Thus indents or protrusions on the surface of the metal not only allow electron 1 to tunnel to another metal with high probability by interference of the de Broglie wave, but also results in the enhanced probability of the tunneling of another electron (electron 3).

This approach will decrease the effective potential barrier between metal and vacuum (the work function).

This approach has many applications, including cathodes for vacuum tubes, thermionic converters, vacuum diode heat pumps, photoelectric converters, cold cathode sources, and many other in which electron emission from the surface is used. In addition, an electron moving from vacuum into an anode electrode having an indented or protruded surface will also experience de Broglie interference, which will promote the movement of said electron into said electrode, thereby increasing the performance of the anode.

Figure 4:
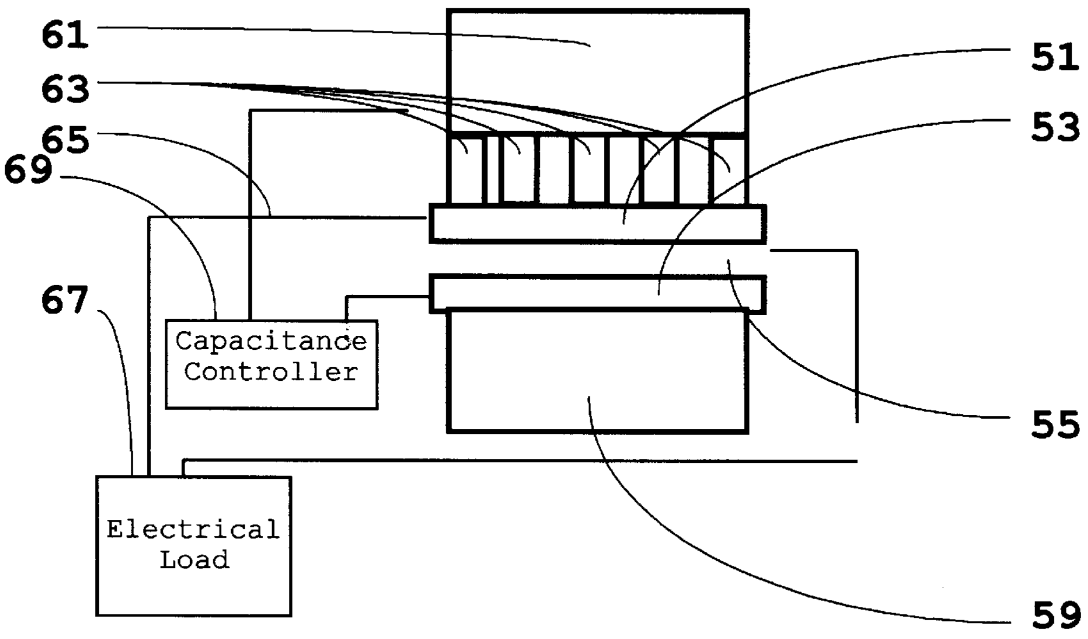
FIG. 4 is a diagrammatic representation of one embodiment of a thermionic converter with electrode separation controlled by piezo-electric actuators.

In a further embodiment, the separation of electrodes in a vacuum diode-based device may be controlled through the use of positioning elements, as shown in FIG. 4. The following description describes a number of preferred embodiments of the invention and should not be taken as limiting the invention.

Referring now to FIG. 4, which shows in a diagrammatic form a heat source 61, a heat sink 59, electrical connectors 65, and an electrical load 67 for a thermionic generator embodiment of the device shown. An electric field is applied to the piezo-electric actuator 63 via electrical connectors 65 which causes it to expand or contract longitudinally, thereby altering the distance 55 between electrodes 51 and 53. Electrodes 51 and 53 are connected to a capacitance controller 69 which controls the magnitude of the field applied by a power supply. Heat from heat source 61 is conducted to an emitter 51. The surface of emitter 51 has an indented or protruded surface as described above. Electrons emitted from emitter 51 move across an evacuated space 55 to a collector 53, where they release their kinetic energy as thermal energy which is conducted away from collector 53 to heat sink 59. The electrons return to emitter 51 by means of external circuit 65 thereby powering electrical load 67. The capacitance between emitter 51 and collector 53 is measured and capacitance controller 69 adjusts the field applied to piezo-electric actuators 63 to hold the capacitance, and consequently the distance between the electrodes 55, at a predetermined fixed value. This means that as the thermionic converter becomes hot and its components expand, the distance between the electrodes can be maintained at a fixed distance. The distance between the electrodes 55 may be controlled by other manipulating means including electroactive, magnetostrictive, and electrostrictive devices.

As is mentioned in other applications, thermionic and thermotunnel converters can operate both way. Therefore in addition to the above description, the device described in FIG. 4 could operate in reverse, pumping heat from a power source, instead of creating power from a heat source.

For currently available materials, a device having electrodes of the order of 1×1 cm, surface irregularities are likely to be such that electrode spacing can be no closer than 0.1 to 1.0 μm. An approach to overcome this limitation which leads to enhanced performance in diode devices is given in a related application, Tavkhelidze and Edelson, filed Aug. 28, 1998. The advantage of the methods disclosed in that application for use in the present invention are specifically noted. The matching surface technique disclosed in that application has novel and beneficial results when combined with the enhanced emission surfaces disclosed in the present invention. Thus, the present invention claims the method of producing matching surfaces, which is disclosed in the other application, in combination with the use of the surfaces described in the present invention.

Summary Ramifications and Scope

The method for enhancing passage of elementary particles through a potential barrier has many applications in addition to those described above.

The method may be employed for increasing emission of particles besides electrons. With proper geometries, virtually any elementary particles whose behaviors can be described as waves, or which have wave properties, could emit more readily using the present invention. This classification includes electrons, protons, photons, neutrons, leptons, alpha particles, or other compound particles.

The method may be applied to thermionic converters, vacuum diode heat pumps and photoelectric converters, where a reduction in work function gives real benefits in terms of efficiency or operating characteristics.

For photoelectric converters, if the substrate is transparent, then photons are allowed to impact directly on the surface which has an appropriate geometric shape as per the present invention. Photons then impact on the electrons in the material, causing them to excite sufficiently to overcome the potential barrier, and emit to the collector electrode. In this manner, the present invention allows for direct photoelectric conversion.

The elementary particle emitting surface has many further applications. The surface is useful on emitter electrodes and other cathodes because it promotes the emission of electrons. It is also useful on collector electrodes and other anodes because it promotes the passage of electrons into the electrode. The surface also has utility in the field of cold cathodes generally, and electrodes incorporating such a surface can be used. Cold cathode structures are useful electron sources for applications such as flat panel displays, vacuum microelectronic devices, amplifiers, heat pumps, and electron microscopes. In addition, the approach has utility in field effect emission, and can be used for the manufacture of field emission electron emitter surfaces, which are particularly suitable for application to display devices.

The same surface structure can also be used to promote the emission of waves, such as radio-frequency waves. Thus the same principles can be applied to the design of antennae for the reception of electromagnetic radiation of any kind. A surface with the proper geometrical shape would be transparent to a specific frequency of electromagnetic radiation, creating an ideal antenna.

Additionally, it is clear that there are advantages to producing a surface with a precise, or tailored work function. Different applications can call for different specifications. In this invention, defects and/or less-than-optimal surface geometries can be employed to make the work function higher than for a material with optimal surface geometries, but still lower than the same material without the geometries disclosed in this invention. In this manner, potentially any desired work function value can be obtained by altering the geometrical or topographical features on the surface of a material.

I claim:

1. A method for promoting tunneling of elementary particles through a potential barrier comprising: creating a potential barrier wherein said potential barrier has an indented or protruded cross-section, wherein the depth of indents in said indented cross-section or the height of protrusions in said protruded cross-section is given by the relationship $\lambda(1+2n)/4$, where $\lambda$ is the de Broglie wavelength of said elementary particle, and where n is 0 or a positive integer.

2. The method of claim 1 in which said elementary particles are selected from the group consisting of electrons, protons, neutrons, alpha particles, compound particles, photons, and leptons.

3. The method of claim 1 wherein said potential barrier is a surface.

4. The method of claim 1 in which n is an integer having a value between 0 and 4.

5. The method of claim 1 in which the width of indents in said indented cross-section or the width of protrusions in said protruded cross-section is of the order of $2\lambda$, where $\lambda$ is the de Broglie wavelength for the elementary particle wave.

6. A method for promoting transfer of elementary particles through a potential barrier comprising: creating a potential barrier wherein said potential barrier has an indented or protruded cross-section, wherein the depth of indents in said indented cross-section or the height of protrusions in said protruded cross-section is given by the relationship $\lambda(1+2n)/4$, where $\lambda$ is the de Broglie wavelength of said elementary particle, and where n is 0 or a positive integer.

7. The method of claim 6 in which said elementary particles are selected from the group consisting of electrons, protons, neutrons, alpha particles, compound particles, photons, and leptons.

8. The method of claim 6 additionally comprising the step of placing a second potential barrier sufficiently separated from said potential barrier having a geometrical shape to substantially prevent tunneling of said elementary particles between said barriers.

9. The method of claim 6 wherein said potential barrier is a surface.

10. The method of claim 6 in which n is an integer having a value between 0 and 4.

11. The method of claim 6 in which the width of indents in said indented cross-section or the width of protrusions in said protruded cross-section is of the order of 2λ, where λ is the de Broglie wavelength for the elementary particle wave.

12. An elementary particle-emitting surface having an indented or protruded cross-section comprising an upper section and a lower section, further wherein the depth of indents or the height of protrusions in said indented or protruded cross-section are comparable to the de Broglie wavelength of said elementary particles such that the probability wave of an elementary particle reflected from said lower section of said surface interferes destructively with the probability wave of an elementary particle reflected from said upper section of said surface, thereby reducing the reflecting probability wave of said elementary particles and increasing the probability of tunneling or transfer of said elementary particles.

13. The elementary particle-emitting surface of claim 12 in which said elementary particles are selected from the group consisting of electrons, protons, neutrons, alpha particles, compound particles, photons, and leptons.

14. The elementary particle-emitting surface of claim 12 wherein the depth of said indents or the height of said protrusions is given by the relationship λ(1+2n)/4, where λ is the de Broglie wavelength for the elementary particle, and n is an integer having a value between 0 and 4.

15. A vacuum diode heat pump comprising:

an anode electrode, and a cathode electrode, wherein the electron-emitting surface of claim 12 forms a part of either or both of said electrodes.

16. The vacuum diode heat pump of claim 15 which additionally comprises at least one controllable positioning means for adjusting the separation of said electrodes.

17. A thermionic converter comprising:

an emitter electrode, and a collector electrode, wherein the electron-emitting surface of claim 12 forms a part of either or both of said electrodes.

18. The thermionic converter of claim 17 which additionally comprises at least one controllable positioning means for adjusting the separation of said electrodes.

19. A photoelectric converter comprising:

an emitter electrode, and a collector electrode, wherein the electron-emitting surface of claim 12 forms a part of either or both of said electrodes.

20. The photoelectric converter of claim 19 which additionally comprises at least one controllable positioning means for adjusting the separation of said electrodes.

21. A thermotunnel converter comprising:

an emitter electrode, and a collector electrode, wherein the electron-emitting surface of claim 12 forms a part of either or both of said electrodes.

22. The thermotunnel converter of claim 21 which additionally comprises at least one controllable positioning means for adjusting the separation of said electrodes.

23. A pair of elementary particle-emitting surfaces of claim 12 for use in a diode device, in which said indented or protruded cross-section of one of said surfaces corresponds to a matching indented or protruded cross-section in the other surface.

24. The pair of the elementary particle emitting surfaces of claim 23 in which said elementary particle is an electron for use in a thermionic diode device selected from the group consisting of thermionic converter, thermo-tunneling converter, vacuum diode heat pump and photoelectric generator.

25. The pair of electrodes of claim 23 in which the spacing between said electrodes is controlled by a manipulating means selected from the group consisting of: electroactive, magnetostrictive, electrostrictive, and piezo-electric means.

26. A thermionic converter having component elementary particle emitting surfaces, wherein said surfaces comprise the pair of elementary particle emitting surfaces of claim 23.

27. The thermionic converter of claim 25 in which the separation of said electrodes is controlled by a piezo-electric element.

28. A thermo-tunneling converter having component elementary particle emitting surfaces, wherein said surfaces comprise the pair of elementary particle emitting surfaces of claim 23.

29. Tile thermo-tunneling converter of claim 28 in which the separation of said electrodes is controlled by a piezo-electric element.

30. A vacuum diode heat pump having component elementary particle emitting surfaces, wherein said surfaces comprise the pair of elementary particle emitting surfaces of claim 23.

31. The vacuum diode heat pump of claim 30 in which the separation of said electrodes is controlled by a piezo-electric element.

32. A photoelectric converter having component elementary particle emitting surfaces, wherein said surfaces comprise the pair of elementary particle emitting surfaces of claim 23.

33. The photoelectric converter of claim 32 in which the separation of said electrodes is controlled by a piezo-electric element.

34. The particle-emitting surface of claim 12 in which the depth of indents in said indented cross-section or the height of protrusions in said protruded cross-section is in the range λ/4 to 9λ/4, where λ is the de Broglie wavelength for the elementary particle wave.

35. The particle-emitting surface of claim 12 in which the width of indents in said indented cross-section or the width of protrusions in said protruded cross-section is of the order of 2λ, where λ is the de Broglie wavelength for the elementary particle wave.

36. A field emission electron emitter surface, wherein said surface has an indented or protruded cross-section comprising an upper and a lower face of said surface, further wherein the depth of indents or the height of protrusions in said indented or protruded cross-section are comparable to the de Broglie wavelength of said electron such that the probability wave of an electron reflected from said lower face of said surface interferes destructively with the probability wave of an electron reflected from said upper face of said surface, thereby reducing the reflecting probability wave of said electrons and increasing the probability of emission of said electrons.

37. The field emission electron emitter surface of claim 35 wherein the depth of said indents or the height of said protrusions is given by the relationship λ(1+2n)/4, where λ is the de Broglie wavelength for the electron, and n is an integer having a value between 0 and 4.

38. The field emission electron emitter surface of claim 35 in which the depth of indents in said indented cross-section or the height of protrusions in said protruded cross-section is in the range λ/4 to 9λ/4, where λ is the de Broglie wavelength for the electron.

39. The field emission electron emitter surface of claim 35 in which the width of indents in said indented cross-section or the width of protrusions in said protruded cross-section is of the order of 2λ, where λ is the de Broglie wavelength for the electron.

40. A surface which is transparent to a specific frequency of electromagnetic radiation, wherein said surface has an indented or protruded cross-section comprising an upper and a lower face of said surface, further wherein the depth of indents or the height of protrusions in said indented or protruded cross-section are comparable to the de Broglie wavelength of said electromagnetic radiation wave such that the probability wave of electromagnetic radiation reflected from said lower face of said surface interferes destructively with the probability wave of electromagnetic radiation reflected from said upper face of said surface, thereby reducing the reflecting probability wave of said electromagnetic radiation.

41. The surface of claim 40 wherein the depth of said indents or the height of said protrusions is given by the relationship λ(1+2n)/4, where λ is the de Broglie wavelength for the electromagnetic radiation, and n is an integer having a value between 0 and 4.

42. The surface of claim 40 in which the depth of indents in said indented cross-section or the height of protrusions in said protruded cross-section is in the range λ/4 to 9λ/4, and the width of said indent or protrusion: is of the order of 2λ, where λ is the de Broglie wavelength for the electromagnetic radiation.

43. The surface of claim 40 in which the width of indents in said indented cross-section or the width of protrusions in said protruded cross-section is of the order of 2λ, where λ is the de Broglie wavelength for the electromagnetic radiation.

44. An elementary particle-emitting surface having an indented or protruded cross-section, wherein the depth of indents in said indented cross-section or the height of protrusions in said protruded cross-section is in the range λ/4 to 9λ/4, where λ is the de Broglie wavelength for the elementary particle wave.

45. The elementary particle-emitting surface of claim 44 in which said elementary particles are selected from the group consisting of electrons, protons, neutrons, alpha particles, compound particles, photons, and leptons.

46. The elementary particle-emitting surface of claim 44 in which said geometrical shape has an indented or protruded cross-section, the depth of said indents or the height of said protrusions being given by the relationship λ(1+2n)/4, where λ is the de Broglie wavelength for the elementary particle, and n is an integer having a value between 0 and 4.

* * * * *